United States Patent
Varvara et al.

(10) Patent No.: US 12,362,152 B2
(45) Date of Patent: Jul. 15, 2025

(54) PLASMA ETCHING APPARATUS AND METHOD

(71) Applicant: SPTS Technologies Limited, Newport (GB)

(72) Inventors: Maxime Varvara, Newport (GB); Codrin Prahoveanu, Newport (GB)

(73) Assignee: SPTS Technologies Limited, Newport (GB)

( * ) Notice: Subject to any disclaimer, the term of this patent is extended or adjusted under 35 U.S.C. 154(b) by 139 days.

(21) Appl. No.: 17/384,155

(22) Filed: Jul. 23, 2021

(65) Prior Publication Data

US 2022/0051881 A1 Feb. 17, 2022

(30) Foreign Application Priority Data

Aug. 12, 2020 (GB) ...................................... 2012560

(51) Int. Cl.
*H01J 37/32* (2006.01)
*H01L 21/3065* (2006.01)
(Continued)

(52) U.S. Cl.
CPC ...... *H01J 37/32623* (2013.01); *H01J 37/321* (2013.01); *H01J 37/32715* (2013.01);
(Continued)

(58) Field of Classification Search
USPC ....................................................... 156/915
See application file for complete search history.

(56) References Cited

U.S. PATENT DOCUMENTS 5,891,348 A * 4/1999 Ye ..................... H01L 21/67069
204/298.31
5,900,064 A * 5/1999 Kholodenko ....... H01L 21/6831
438/758
(Continued)

FOREIGN PATENT DOCUMENTS

| EP | 3133635 A1 | 2/2017 |
| TW | 201719709 A | 6/2017 |
| TW | 201907760 A | 2/2019 |

OTHER PUBLICATIONS

IPO, Search Report for GB Application No. 2012560.5, Jan. 13, 2021.
(Continued)

*Primary Examiner* — Ram N Kackar
(74) *Attorney, Agent, or Firm* — Hodgson Russ LLP

(57) ABSTRACT

A plasma etching apparatus for etching a semiconductor substrate comprises: a plasma chamber; a plasma generation device for sustaining a plasma within the plasma chamber; a substrate support disposed within the plasma chamber for supporting the semiconductor substrate, the substrate support comprising an electrically conductive structure; a power supply for providing an RF electrical signal having an RF power to the electrically conductive structure; and an annular dielectric ring structure comprising a backside surface, the backside surface comprising an electrically conductive coating; wherein the electrically conductive structure is spaced apart from and extends under the electrically conductive coating so that when RF power is provided to the electrically conductive structure the RF power couples to the electrically conductive coating. Associated methods are also disclosed.

18 Claims, 6 Drawing Sheets

(51) Int. Cl.
*H01L 21/683* (2006.01)
*H01L 21/687* (2006.01)

(52) U.S. Cl.
CPC ...... *H01L 21/3065* (2013.01); *H01L 21/6831* (2013.01); *H01L 21/68721* (2013.01); *H01L 21/68757* (2013.01); *H01J 2237/2007* (2013.01); *H01J 2237/334* (2013.01)

(56) References Cited

U.S. PATENT DOCUMENTS

| | | | | |
|---|---|---|---|---|
| 6,013,984 | A | * | 1/2000 | Ellinger .............. C23C 16/4401 315/111.21 |
| 7,658,816 | B2 | | 2/2010 | Koshiishi et al. |
| 2010/0025369 | A1 | * | 2/2010 | Negishi ............. H01J 37/32935 216/60 |
| 2010/0203736 | A1 | * | 8/2010 | Ichino ............... H01J 37/32183 257/E21.218 |
| 2014/0242780 | A1 | | 8/2014 | Gauldin et al. |
| 2018/0025891 | A1 | | 1/2018 | Marakhtanov et al. |
| 2018/0190526 | A1 | * | 7/2018 | Hao .................. H01J 37/32082 |
| 2019/0006155 | A1 | * | 1/2019 | Zhao ................ H01J 37/32155 |
| 2019/0228952 | A1 | * | 7/2019 | Dorf ................... H01L 21/6833 |
| 2019/0362949 | A1 | | 11/2019 | Sarode |

OTHER PUBLICATIONS

EPO, European Search Report for EP Application No. 21186252, Jan. 21, 2022.

TIPO, Office Action issued in TW Patent Application No. 110129059, Mar. 24, 2025.

* cited by examiner (A)　　　　　　　　　　(B)

(A)

(B)

(A)

(B)

(A)

(B)

PLASMA ETCHING APPARATUS AND METHOD

CROSS-REFERENCE TO RELATED APPLICATIONS

This application claims priority to the U.K. patent application filed Aug. 12, 2020 and assigned App. No. 2012560.5, the disclosure of which is hereby incorporated by reference.

FIELD OF THE DISCLOSURE

This invention relates to a plasma etching apparatus for etching a substrate, in particular a semiconductor substrate. This invention also relates to associated methods of plasma etching.

BACKGROUND OF THE DISCLOSURE

When etching semiconductor substrates, such as silicon wafers, in industrial applications there is a requirement that the etch profile is uniform across the whole substrate. Preferably, good etch uniformity is maintained at a peripheral region of the substrate, for example to within 3 mm of the exposed substrate edge, so that a greater area of the substrate can be utilised.

However, due to discontinuities or variations in any one of a number of parameters (e.g. gas flow, temperature and plasma density), it is challenging to maintain good plasma etch uniformity across the full area of the substrate, in particular at or towards the periphery of the substrate. Furthermore, as process conditions change during an etch process (e.g. RF power applied to substrate support, RF frequency, and pressure), the uniformity of the plasma will change accordingly, which can have adverse effects on the etch uniformity, in particular at or towards a periphery of the substrate. Further still, RF discontinuities and topological changes at the periphery of the wafer can also have a negative impact on the profile of etched features.

Known plasma etch methods can result in etched features (e.g. trenches) at or towards the edge of the substrate having an etch tilt. FIGS. 1(A) and 1(B) show SEM images of a cross-section of trenches 10 etched in a silicon wafer 12 using known methods. The etched trenches 10 at the periphery of the wafer have an outward tilt from vertical of 7.8°. The etch tilt angle is the angle at which the etched feature deviates from vertical. An "outward tilt" corresponds to an etched feature in which the top 14 of the feature is more radially outward than the base 16 of the feature (i.e. the feature 10 leans towards the edge of the wafer). An "inward tilt" corresponds to an etched feature in which the top of the feature is more radially inward than the base of the feature (i.e. the feature leans towards the centre of the wafer). In either case, a large tilt (e.g. as shown in FIGS. 1(A) and 1(B)) would be outside typical uniformity specifications, resulting in a loss of yield in these regions. It is therefore desirable to develop a plasma etching apparatus that can provide improved etch tilt and uniformity, in particular at a peripheral region of the substrate, so that a greater proportion of the substrate contains etched features of acceptable quality. This would improve yield, reduce waste, and lower processing costs.

The etch tilt angle is determined by the angle at which species in the plasma bombard the substrate (i.e. the angle of incidence). In a plasma etch tool with an RF-powered wafer support (e.g. where an anisotropic plasma is used), the shape of the associated plasma sheath determines the angle of incidence of the species (e.g. ions) in the plasma. In general, the species (e.g. ions) in the plasma travel substantially perpendicular to the plasma sheath boundary layer. It is generally preferable for the plasma sheath to be substantially parallel to the exposed surface of the substrate in order to etch vertical features with an etch tilt angle of about zero. However, the plasma sheath typically comprises a curvature at or towards the edge of the substrate being etched, which leads to an unwanted etch tilt in this region.

By way of example only, FIG. 2 shows an approximate representation of the shape of plasma sheath boundary layers at an edge of an RF-powered substrate support 20 as a function of RF power (with other parameters remaining constant). The RF-powered substrate support comprises an electrostatic chuck (ESC) ceramic 22, a metal platen 24 capable of being powered with an RF power, and a ceramic platen cover 26. An annular uniformity ring 28 is provided to surround the substrate 212.

FIG. 2(A) shows a representation with a high frequency (HF) RF signal of 13.56 MHz applied to the substrate support. At low RF power, the species in the plasma have a trajectory directed radially outwardly, which leads to etched features having an inward tilt. On the other hand, at high RF power, the species in the plasma have a trajectory directed radially inwardly, which leads to etched features having an outward tilt. Whilst it may be possible to control the etch tilt to some extent by controlling the RF power (at HF), this can have a detrimental effect on other etch parameters or provide a process window which is difficult to control.

FIG. 2(B) shows a representation with a low frequency (LF) RF signal of 380 kHz applied to the substrate support. The drop of the plasma sheath at the edge of the substrate is more abrupt when a LF RF power is used. Consequently, even at low RF power, the species in the plasma have a trajectory directed radially inwardly, which leads to the etched features having an outward tilt. Increasing the RF power (at LF) further increases the inward trajectory of the species in the plasma, leading to a larger outward tilt. Where LF RF power is used, it is unlikely to achieve a satisfactory etch uniformity at a peripheral region of the substrate simply by tuning the power applied to the substrate support.

It is desirable to develop an apparatus that can provide improved etch uniformity and etch profile (e.g. improved etch tilt) when either HF or LF RF power is applied to the substrate support.

Furthermore, in some etch applications (e.g. through silicon via (TSV) etching), the edge of the substrate must be protected from the plasma processing conditions. In these processes, a wafer edge protection (WEP) structure can be used in the place of a uniformity ring. A WEP structure is typically an insulating annular ring which covers but does not touch a peripheral region of the substrate. For example, the WEP structure can cover a peripheral region about 1-2 mm from the substrate edge. However, using a WEP structure can adversely affect the shape of the plasma sheath, leading to larger etch tilt angles towards the edge of the wafer. In particular, the outward tilt becomes even more pronounced when LF RF power is used. It is desirable to develop an apparatus that can minimise etch tilt non-uniformity in the proximity of a WEP structure, irrespective of whether LF or HF RF power is applied.

BRIEF SUMMARY OF THE DISCLOSURE

The present invention, in at least some of its embodiments, seeks to address at least some of the above described problems, desires and needs. In particular, the present invention, seeks to reduce edge tilt non-uniformity, in particular at a peripheral region of the substrate, over a wide range of process windows for etch applications which use uniformity rings or WEP structures. The present invention also seeks to minimise the curvature of the plasma sheath boundary layer at a peripheral region of the substrate, both when a HF and LF polarisation is applied to a substrate support. The present invention also seeks to achieve good etch tilt control for both HF and LF polarisations, thus reducing the down time of etch apparatus between different etch applications.

According to a first aspect of the invention there is provided a plasma etching apparatus for etching a semiconductor substrate, the plasma etching apparatus comprising:
a plasma chamber;
a plasma generation device for sustaining a plasma within the plasma chamber;
a substrate support disposed within the plasma chamber for supporting the semiconductor substrate, the substrate support comprising an electrically conductive structure;
a power supply for providing an RF electrical signal having an RF power to the electrically conductive structure; and
an annular dielectric ring structure comprising a backside surface, the backside surface comprising an electrically conductive coating;
wherein the electrically conductive structure is spaced apart from and extends under the electrically conductive coating so that when RF power is provided to the electrically conductive structure the RF power couples to the electrically conductive coating.

The present inventors have found that using an electrically conductive coating (e.g. a metal coating) on the backside of the annular ring can reduce the etch tilt at a peripheral region of the substrate. The improvements in etch uniformity and control of etch tilt are observed when either a high frequency (HF) or low frequency (LF) RF electrical signal is applied to the substrate support. However, the effects are particularly advantageous when a LF RF power is applied to the substrate support because a significant improvement in etch control can be achieved.

Furthermore, the present invention provides a significant improvement (reduction) in micro-masking. Micro-masking occurs when the annular dielectric ring structure (or other insulating parts) exposed to the plasma conditions is sputtered as a result of the RF power applied to the substrate support. Micro-masking is particularly prevalent when the width of the electrically conductive structure extends under the annular dielectric ring structure, and a HF RF power is used during the etch process. By providing an electrically conductive coating to the backside of the annular dielectric ring structure, the extent of micro-masking can be significantly reduced.

The annular dielectric ring structure can comprise a wafer edge protection (WEP) structure. The WEP structure typically extends over a peripheral region of the substrate so that the peripheral region is shielded from the plasma being sustained in the plasma chamber. The WEP structure is spaced apart from the substrate during plasma etching. The WEP structure can comprise an inner perimeter which defines a plasma etching area. The diameter of the inner perimeter of the WEP structure is typically smaller than the diameter of the substrate, for example, by up to about 3 mm, optionally about 1-2 mm. The electrically conductive structure can extend beyond the inner perimeter of the WEP structure, and hence can extended beyond the plasma etching area. Etch processes which require the use of WEP structures are particularly prone to etch non-uniformities at the exposed periphery of the substrate, and to experience micro-masking. However, the present invention can significantly improve etch tilt and etch uniformity control for these processes, and also reduce the degree of micro-masking.

The annular dielectric ring structure can comprise a uniformity ring. The uniformity ring can extend around an outer perimeter of the substrate during plasma etching. For example, the uniformity ring can surround the substrate. The uniformity ring can have an inner perimeter. The diameter of the inner perimeter of the uniformity ring is typically larger than the diameter of the substrate, for example, by about 1-5 mm, optionally about 2-3 mm.

The annular dielectric ring structure can comprise a uniformity ring and a WEP structure. The uniformity ring can be positioned on the WEP structure to form a stack of annular dielectric rings. A stack of dielectric rings can better stabilise the uniformity of the plasma sustained in the plasma chamber.

The apparatus can comprise a semiconductor substrate positioned on the substrate support. The uniformity ring can comprise an inner diameter that is larger than the diameter of the semiconductor substrate by a distance in the range of 1-5 mm, optionally 2-4 mm, optionally about 3 mm. For example, for a 200 mm diameter semiconductor substrate, the inner diameter of the uniformity ring can be in the range of 201-205 mm, optionally 202-204 mm, optionally about 203 mm.

The annular dielectric ring structure can be made from a ceramic material. The ceramic material can be $Al_2O_3$. The ceramic material can be $SiO_2$, AlN, $Er_2O_3$.

The backside surface of the annular dielectric ring structure faces away from the plasma being sustained in the plasma chamber. Accordingly, the backside surface, and hence the electrically conductive coating, is not exposed to the plasma. The electrically conductive coating can be made from a metal or a metal alloy. The metal can be aluminium or titanium. The electrically conductive coating can comprise a plurality of electrically conductive layers, such as a plurality of metallic layers. This can improve functionality, e.g. improve adhesion to the ceramic and lower resistivity. A dielectric passivation layer can be applied to the surface of the electrically conductive coating to protect the metal coating from exposure to the chamber environment.

The electrically conductive coating can have a thickness of less than about 50 µm, optionally less than 30 µm, optionally less than 20 µm, or optionally about 10 µm.

The electrically conductive coating can comprise a radially inner region and a radially outer region. The radially outer region can be spaced apart from the electrically conductive structure by a smaller distance than the radially inner region. The backside surface can comprise an annular step. The step can demarcate the radially inner and radially outer regions of the electrically conductive coating.

The electrically conductive coating can have an electrical potential that is electrically floating. The electrically conductive coating is typically electrically isolated from the electrically conductive structure. Typically, the RF power provided to the electrically conductive structure capacitively couples to the electrically conductive coating, i.e., by capacitive coupling.

The annular dielectric ring structure can comprise a frontside surface facing away from the substrate support. The frontside surface can comprise a radially inwardly facing inclined portion. The frontside surface faces towards (and is typically exposed to) a plasma being sustained in the plasma chamber. The radially inwardly facing inclined portion can be linear, curved or a combination thereof. For example, the radially inwardly facing inclined portion can be concave.

The width of the electrically conductive structure can define an area that can be provided with an RF electrical signal having an RF power (hereinafter referred to as the "RF-powered area"). The electrically conductive structure typically has a width that is greater than the diameter of the substrate being processed. Consequently, the RF-powered area typically extends beyond (i.e. radially outward of) the edge of the substrate being processed. Without being bound by any theory or conjecture, it is believed that by extending the RF-powered area beyond the edge of the substrate, the drop of the plasma sheath at the interface between the RF-powered area and the surrounding non-driven parts (e.g. the annular dielectric ring structure) is moved further radially outward from the edge of the wafer. This reduces the curvature of the plasma sheath at the periphery of the exposed substrate, and consequently reduces the outward tilt of the etched features. Therefore, the etch tilt angle, in particular at a peripheral region of the substrate, can be minimised. For example, the observed etch tilt up to about 2 mm from the exposed edge of the substrate can be improved when the width of the RF-powered area is increased to extend beyond the edge of the substrate, for example, to a width of >200 mm, optionally ≥210 mm or optionally about 221 mm, when processing a 200 mm diameter substrate.

The electrically conductive structure extends under a radially inner part of the electrically conductive coating. For example, a radially outer edge of the electrically conductive structure can reside substantially vertically under the electrically conductive coating; or can reside radially outward of the electrically conductive coating. The electrically conductive structure can extend radially outward of the electrically conductive coating. The electrically conductive structure can have a width of >200 mm, optionally ≥210 mm, optionally ≥210 mm, optionally about 221 mm. Surprisingly, despite the electrically conductive structure extending under the annular dielectric ring structure, the presence of the electrically conductive coating on the backside of the annular dielectric ring structure results in a significant reduction in the degree of micro-masking, in particular when a HF RF power is applied to the substrate support.

The electrically conductive structure can comprise an electrode. The electrically conductive structure can comprise a conductive body (e.g. an electrode). The electrically conductive structure can comprise a conductive ring surrounding the conductive body. Each of the electrically conductive body and the conductive ring can be provided with an RF electrical signal having an RF power. The conductive body and the conductive ring can together define the RF-powered area. The conductive body can be made from a metallic material, including a metal or a metal alloy. The conductive ring can be made from a metallic material, including a metal or metal alloy. Advantageously, the conductive ring may be retrofitted onto existing substrate supports so as to increase the width of the electrically conductive structure, and thereby increase the width of the RF-powered area. This can enable existing apparatus to be modified to achieve the technical effects of the present invention.

The substrate support can comprise an electrostatic chuck (ESC). The conductive ring can surround the ESC.

The RF electrical signal can have a low RF frequency. For example, the RF electrical signal can have a frequency of less than about 2 MHz, optionally less than about 1 MHz, optionally less than about 500 kHz, or optionally about 380 kHz.

The RF electrical signal can have a high RF frequency. For example, the RF electrical signal can have a frequency of greater than or equal to about 2 MHz, optionally about 13.56 MHz.

The RF power can be a power in a range of 5-500 W, optionally in the range of 33-400 W, or optionally in a range of 50-300 W. By providing an RF power to the substrate support, the plasma being sustained within the plasma chamber is anisotropic. For example, when a suitable RF bias power is applied to the substrate support, the species (e.g. ions and radicals) in the plasma are generally directed towards the substrate with substantially similar incident trajectories (dependent upon the shape of the plasma sheath) so that high aspect ratio features can be produced.

The semiconductor substrate can be a silicon wafer. The silicon wafer can have a diameter of about 150 mm, about 200 mm, or about 300 mm.

The plasma etching apparatus can be an inductively coupled plasma etching apparatus. The plasma generation device can be a coil.

According to a second aspect of the invention, there is provided a method of plasma etching a semiconductor substrate using the apparatus of the first aspect, the method comprising the steps of:
providing a semiconductor substrate on the substrate support;
sustaining a plasma in the plasma chamber; and
providing an RF power to the electrically conductive structure so that the RF power couples to the electrically conductive coating.

Whilst the invention has been described above, it extends to any inventive combination of the features set out above, or in the following description, drawings or claims. For example, any features disclosed in relation to one aspect of the invention may be combined with any features disclosed in relation to any of the other aspects of the invention.

DESCRIPTION OF THE DRAWINGS

Embodiments of the invention will now be described, by way of example only, with reference to the accompanying drawings, in which.

DETAILED DESCRIPTION OF THE DISCLOSURE

Figure 1:
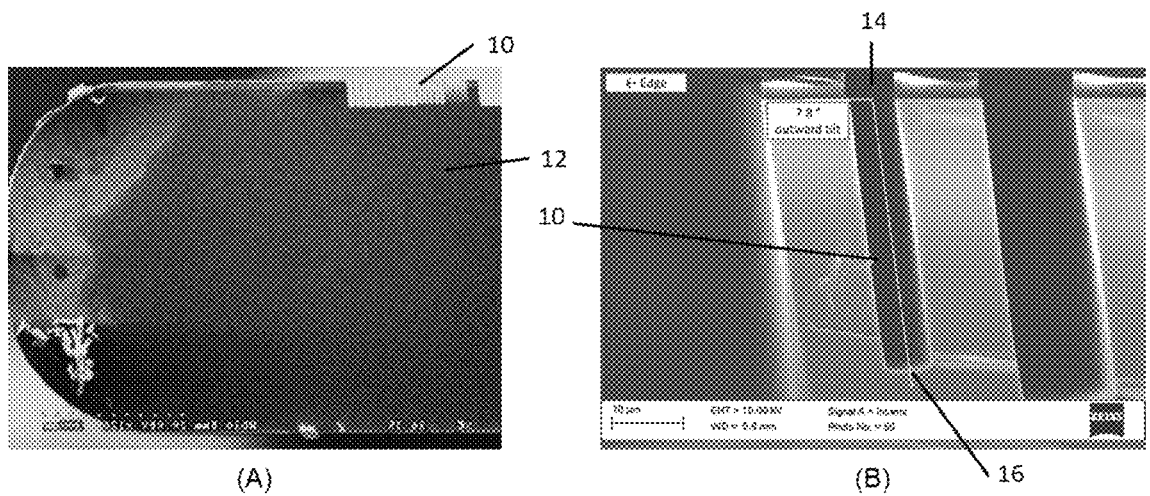
FIG. 1 shows SEM images of the edge of a silicon wafer after a known etching process, where (B) is at a higher magnification than (A)
Figure 2:
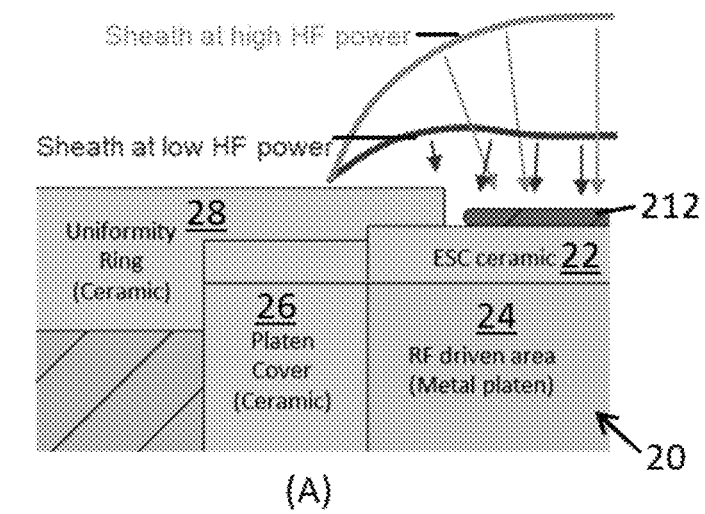
FIG. 2 shows representations of plasma sheath boundary layers as a function of (A) HF power and (B) low HF power applied to the substrate support.
Figure 2:
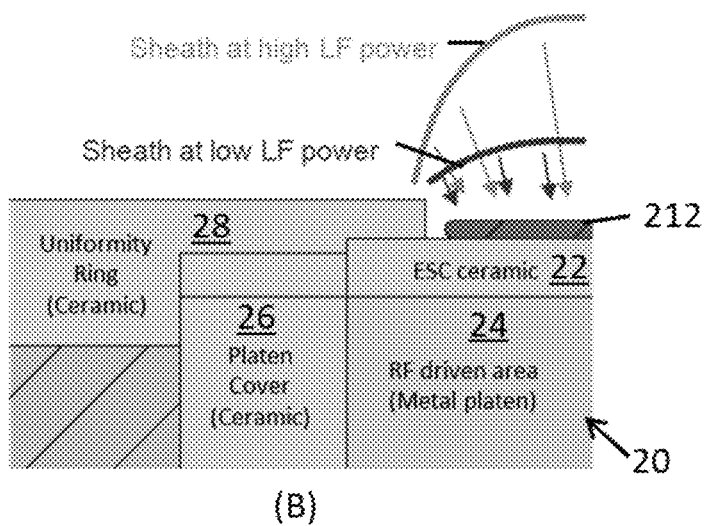

In the following description, comparative examples were performed on an ICP-based SPTS Rapier® plasma etch tool, which is commercially available from SPTS Technologies Limited of Newport, South Wales, UK. Comparative examples used 200 mm silicon wafers, running a known 'Bosch process' Si etch. As described in detail below, embodiments of the present invention may be retrofitted onto existing plasma etching apparatus.

Where the same reference numeral has been used in different figures and/or embodiments, the feature to which it relates corresponds to a substantially identical feature.

Plasma etching apparatus according to embodiments of the present invention comprise a plasma chamber and a plasma generation device for sustaining a plasma within the chamber. The plasma etching apparatus further comprises a substrate support for supporting a substrate, such as a semiconductor substrate, thereon during a plasma etch process. The substrate support comprises an electrically conductive structure. The substrate support can comprise an ESC and/or a metallic platen. The substrate support is configured to be provided with an RF electrical signal having an RF bias power from a suitable power supply.

Figure 3:
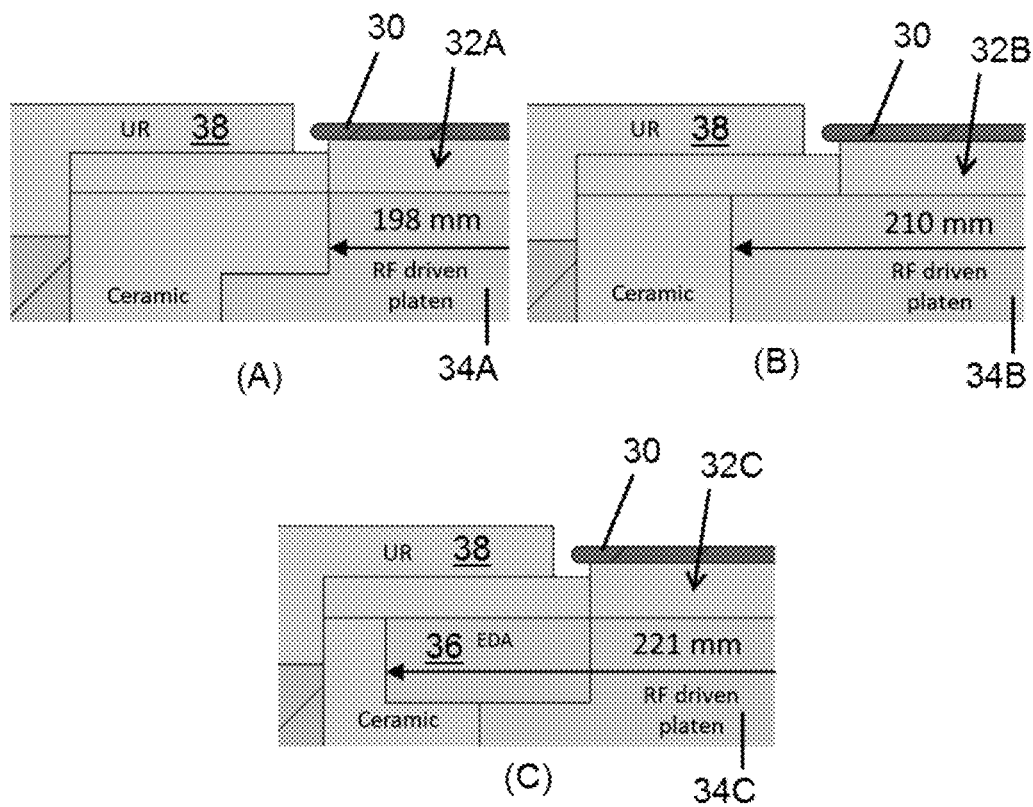
FIG. 3 shows a cross-sectional view of a substrate support with a RF-powered area having a width of (A) 198 mm, (B) 210 mm, and (C) 221 mm.

FIG. 3(A) shows a part of a plasma etching apparatus, wherein a 200 mm diameter substrate 30 is being supported on a substrate support 32A. The substrate support 32A comprises, as an electrically conductive structure, a metallic platen 34A. The metallic platen 34A has a width of 198 mm, and therefore terminates radially inward of the outer edge of the substrate 30. The width of the electrically conductive structure defines an area which can be driven by an RF power (hereinafter referred to as the "RF-powered area" or "driven area").

FIG. 3(B) shows a similar plasma etching apparatus as FIG. 3(A), except the metallic platen 34B has a width of 210 mm, and therefore terminates radially outward of the outer edge of the substrate 30.

FIG. 3(C) shows a similar plasma etching apparatus as FIG. 3(A), except the substrate support 32C comprises a metallic platen 34C and an additional conductive ring 36 surrounding a part of the platen 34C. The metallic platen 34C and the conductive ring 36 are electrically connected so that when an RF powered is provided to the electrically conductive structure, both the metallic platen 34C and the conductive ring 36 are powered with RF power. Consequently, the RF-powered area (also referred to as the "driven area" (DA)) is extended by virtue of the conductive ring 36. The RF-powered area shown in FIG. 3(C) has a width of 221 mm. The conductive ring 36, such as a metallic ring, can be retrofitted onto existing plasma etch apparatus in order to extend the RF-powered area.

In each of FIGS. 3(A), (B) and (C), the substrate is surrounded by a ceramic uniformity ring 38. The annular uniformity ring 38 has an inner diameter of about 202 mm (i.e. about 2 mm larger than the diameter of the substrate). The annular uniformity ring 38 shown in FIGS. 3(A), (B) and (C) surrounds the substrate 30 during a plasma etch process. The annular uniformity ring 38 is used to improve the uniformity of the plasma during a plasma etch process.

Plasma etch processes were performed using the apparatus shown in FIGS. 3(A), (B) and (C), and the etch tilt angle was measured as a function of distance from the edge of the substrate. A positive tilt angle corresponds to an outward tilt, and a negative tilt angle corresponds to an inward tilt.

Figure 4:
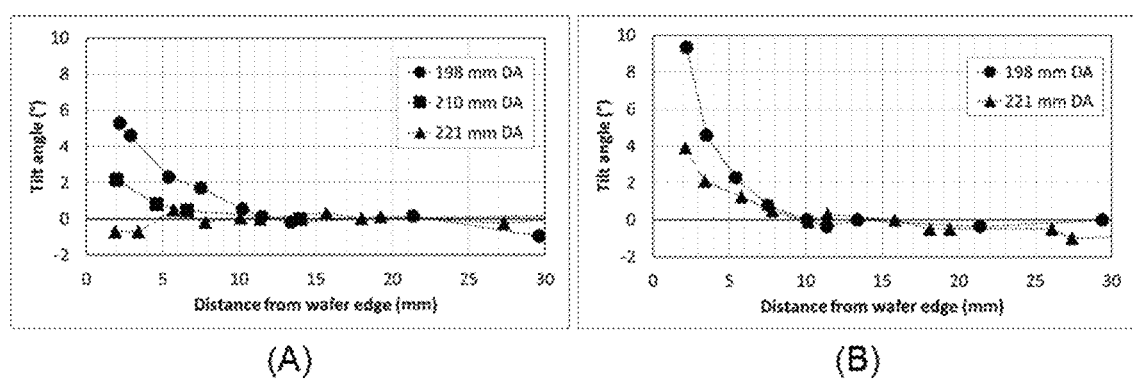
FIG. 4 shows a plot of etch tilt angle (°) as a function of distance from substrate edge where the frequency of the RF power was (A) 13.56 MHz, and (B) 380 kHz.

FIG. 4(A) shows a plot of etch tilt angle as a function of distance from the substrate edge when the RF electrical signal applied to the substrate support had a high frequency (HF) of 13.56 MHz and 300 W power. FIG. 4(B) shows a plot of etch tilt angle as a function of distance from the substrate edge when the RF electrical signal applied to the substrate support had a low frequency (LF) of 380 kHz again using 300 W power. In both cases, the degree of outward tilt decreased as the width of the RF-powered area increased. For example, with reference to FIG. 4(B), the degree of outward tilt decreased from ~10° to ~4° at a distance 2 mm from the edge of the wafer as the width of the RF-powered area increased from 198 mm to 221 mm.

Without wishing to be bound by any theory or conjecture, it is believed that extending the RF-powered area causes the drop of the plasma sheath at the interface between the RF-powered area and the surrounding non-driven annular dielectric ring (e.g. uniformity ring) is moved more radially outwards, away from the edge of the substrate. Consequently, the curvature of the plasma sheath at the edge of the substrate is reduced, which reduces the degree of outward tilt of the etched features in a peripheral region of the substrate. This effect is more pronounced at high frequency RF power. Again, without wishing to be bound by any theory or conjecture, it is believed that the plasma sheath extends less far beyond the edge of the wafer (and hence has a higher curvature) when LF RF power is used.

Some etching applications require a wafer edge protection (WEP) structure, rather than a uniformity ring, to protect an edge region of the substrate from the harsh plasma etch conditions. The WEP structure covers an edge region of the substrate without contacting the substrate to shield the edge region from the plasma. The WEP structure can have an inner diameter of about 197 mm (i.e. 3 mm smaller than the substrate diameter). In this example, the WEP structure will cover about a 1.5 mm wide edge region around the perimeter of the substrate.

Figure 5:
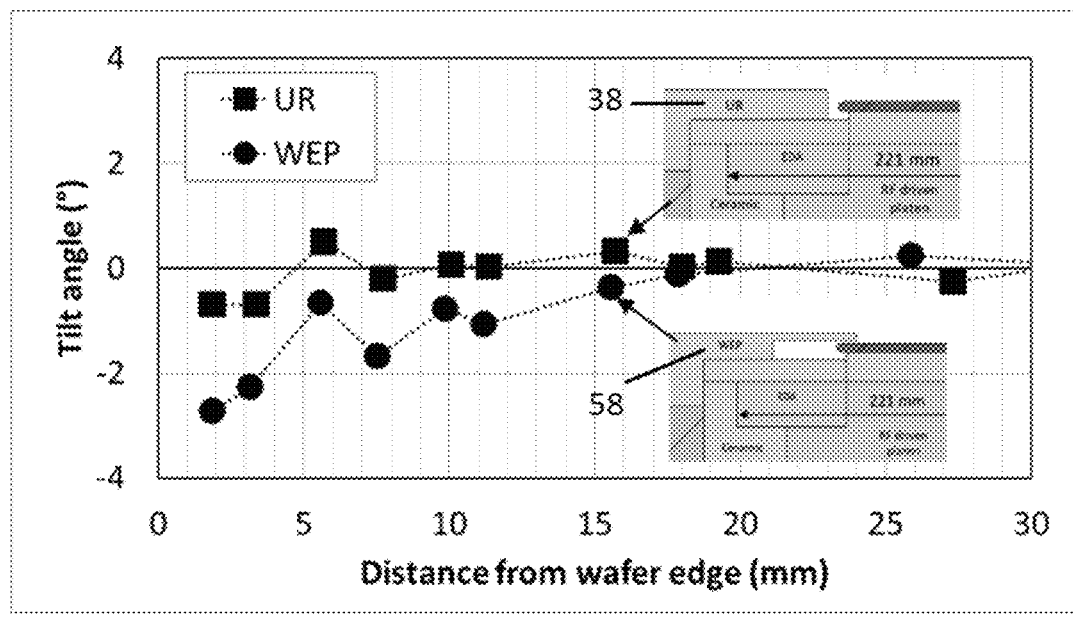
FIG. 5 shows a plot of etch tilt angle (°) as a function of distance from substrate edge where the frequency of the RF power was (A) 13.56 MHz, and (B) 380 kHz.
Figure 5:
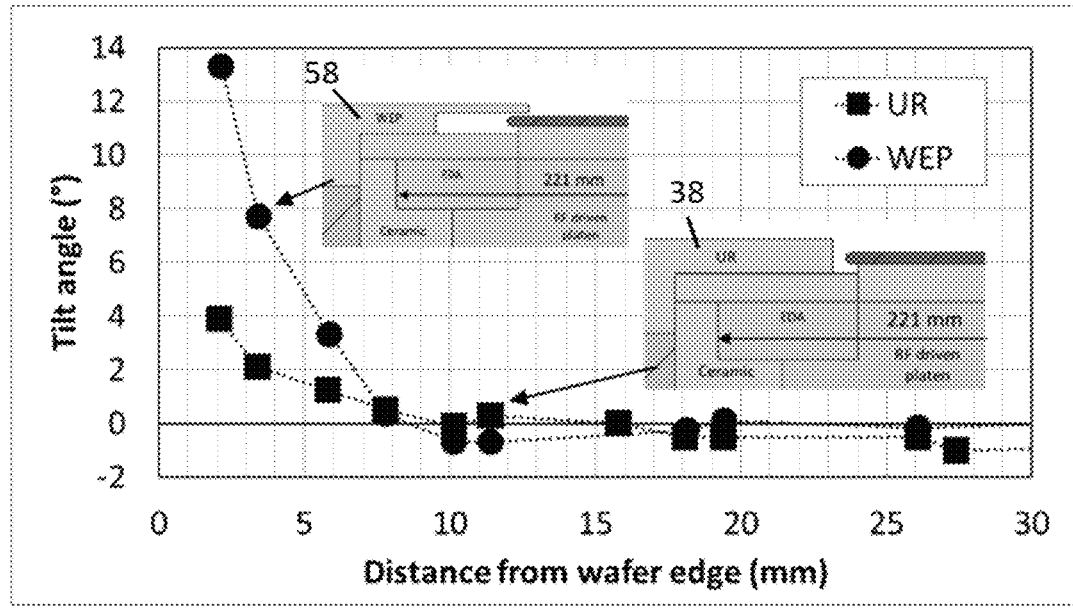

FIG. 5(A) shows a plot of etch tilt angle as a function of distance from the substrate edge at a high RF frequency of 13.56 MHz, using the substrate support shown in FIG. 3(C). Using a WEP structure 58 (instead of a uniformity ring 38) increased the magnitude of the inward tilt from ~1° to ~3° at 2 mm edge exclusion.

FIG. 5(B) shows a plot of etch tilt angle as a function of distance from the substrate edge at a low RF frequency of 380 kHz, using the substrate support shown in FIG. 3(C). Using a WEP structure 58 (instead of a uniformity ring 38) increased the magnitude of the outward tilt from ~4° to ~14°.

Without wishing to be bound by any theory or conjecture, it is believed that due to the smaller diameter of the WEP structure (compared to a uniformity ring), the plasma sheath exhibits a larger curvature closer to the edge of the substrate. Consequently, the magnitude of the tilt is larger when a WEP structure is used. These effects are more pronounced at LF RF power.

To further reduce the edge tilt effects, the present inventors have found that applying an electrically conductive coating to the backside of the annular dielectric ring (e.g. uniformity ring or WEP structure) can significantly reduce the etch tilt angle, in particular at or towards the edge of the substrate.

Figure 6:
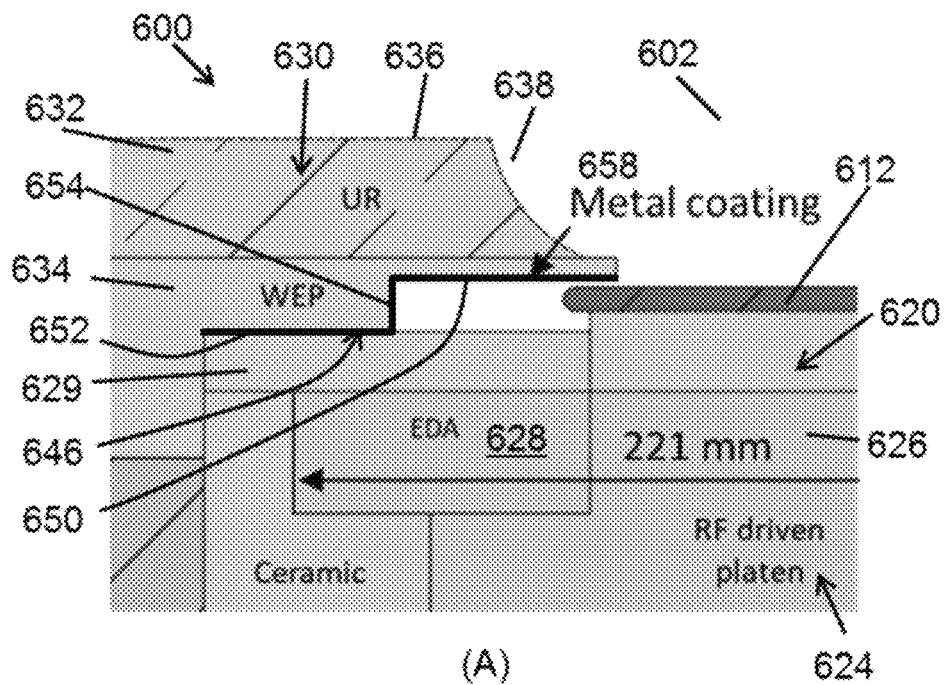
FIG. 6 shows cross-sectional views of an apparatus comprising a stack of annular dielectric rings, where (A) includes a metallised WEP and (B) includes a non-metallised WEP.
Figure 6:
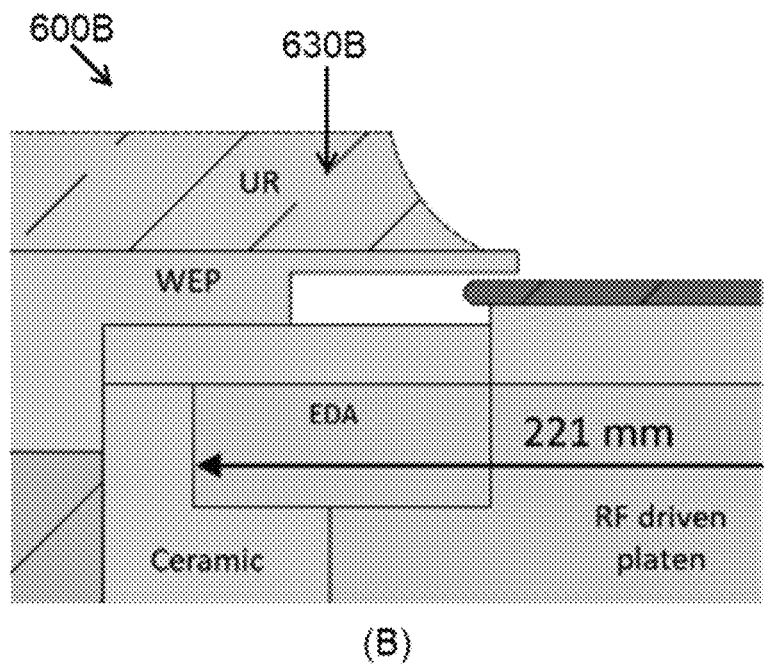

FIG. 6(A) shows a first embodiment of a part of a plasma etching apparatus, shown generally as 600. In this embodiment, the plasma etching apparatus 600 is an inductively coupled plasma (ICP) etching apparatus, although other types of plasma etching apparatus can be used. The apparatus 600 comprises a plasma chamber 602 and a plasma generation device (not shown), such as a coil, substrate support 620 for support a substrate, such as a semiconductor substrate 612; and a power supply (not shown) for providing an RF electrical signal having an RF power to the substrate support 620.

The substrate support 620 comprises an electrically conductive structure 624. The substrate support can comprise an ESC and/or a platen, such as a metallic platen. The electrically conductive structure 624 has a width that extends beyond the radially outer edge of the substrate 612. The substrate support 620 is configured to be provided with an RF bias power from a suitable power supply. The area that can be powered by RF power (i.e. the RF-powered area) extends beyond the radially outer edge of the substrate 612. In the example of FIG. 6(A), the substrate support 620 comprises a metallic platen 626 and an additional conductive ring (e.g. a metallic ring) 628 surrounding a part of the platen 626. The width of the platen 626 can be about 198 mm. The annular conductive ring 628 is configured to extend the RF-powered area of the platen 626. The width of the RF-powered area is about 221 mm.

An annular dielectric ring structure 630 is positioned to extend around the substrate. The annular dielectric ring structure is made from a dielectric material, such as a ceramic material. In the first embodiment, the annular dielectric ring structure 630 comprises a uniformity ring 632 stacked on top of a WEP structure 634 (i.e. a stack of dielectric annular rings). However, in other embodiments, the annular dielectric ring structure can be a uniformity ring 632 or a WEP structure 634. The annular dielectric ring structure 630 covers an edge region of the substrate 612, and is spaced apart therefrom, so as to protect the edge region from the plasma conditions during an etch process.

The annular dielectric ring structure 630 has a frontside surface 636 which faces towards (and is typically exposed to) the plasma during a plasma etch process. In the example shown, the frontside surface 636 is the surface of the uniformity ring 632 that faces towards the plasma during a plasma etch process. A cutaway portion 638 in the uniformity ring 632 causes the frontside surface 636 to comprise a radially inwardly facing inclined portion. In the example shown, the radially inwardly facing inclined portion is concave. However, the invention is not limited by the shape of the frontside surface 636.

The annular dielectric ring structure 630 comprises a backside surface 646 which faces away from the plasma during a plasma etch process (i.e. faces towards the substrate support). In the example of FIG. 6(A), the WEP structure 634 comprises the backside surface 646. The backside surface 646 can rest on the substrate support 620, but is spaced apart from the electrically conductive structure 624 by an insulating (e.g. ceramic) part, such as a cover 629.

In the example of FIG. 6(A), the backside surface comprises a radially inner region 650 and a radially outer region 652, which are separated by a step 654. The radially outer region 652 is disposed closer to the electrically conductive structure 624 than the radially inner region 650. The radially inner region 650 extends over an edge region of the substrate 612 and is spaced apart therefrom.

The backside surface 646 comprises an electrically conductive coating 658, such as a metallic coating. The metallic coating 658 can be made from aluminium, titanium, or any other conductive metal or metal alloy which is suitable for use under plasma processing conditions. In this example, the electrically conductive coating has a thickness of about 10 μm. In other embodiments, the electrically conductive coating can have a thickness of less than about 50 μm. At least a part of the electrically conductive coating 658 is disposed above the electrically conductive structure 624 so that when RF power is provided to the electrically conductive structure 624, the RF power couples to the electrically conductive coating 658. Put another way, the electrically conductive structure extends under the electrically conductive coating 658. This can significantly reduce problems associated with etch tilt at a peripheral region of the substrate during an etch process (as described above). In the embodiment shown in FIG. 6(A), each of the radially inner region 650, radially outer region 652, and the substantially vertical surface of the step 654 comprise the electrically conductive coating 658.

FIG. 6(B) shows a comparative apparatus 600B, which is identical to that of apparatus 600, except that the backside of the annular dielectric ring structure 630B does not comprise an electrically conductive coating 658.

Figure 7:
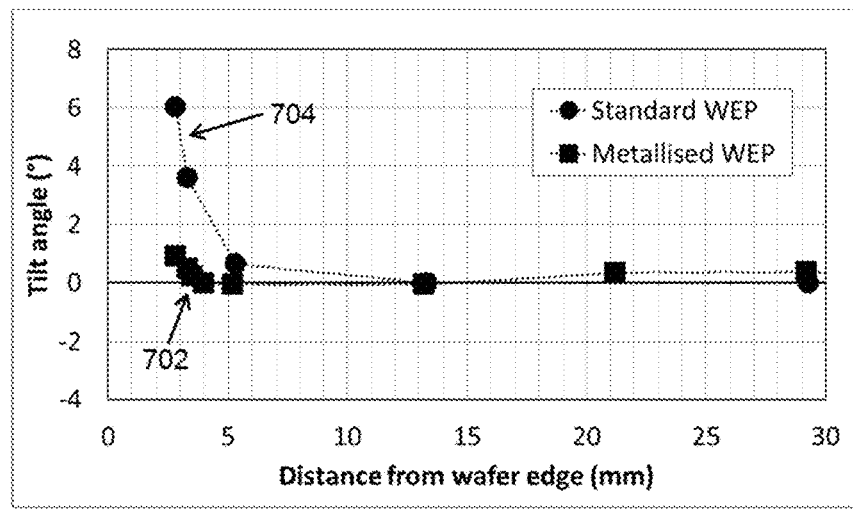
FIG. 7 shows plots of etch tilt angle (°) as a function of distance from substrate edge for two uniformity ring/WEP configurations, where (A) uses a first stack of annular dielectric ring structures and (B) uses a second stack of annular dielectric ring structures.
Figure 7:
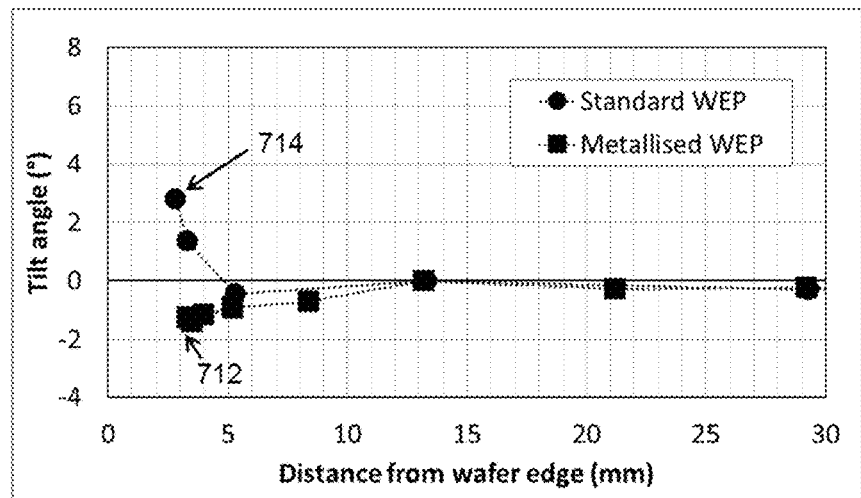

FIGS. 7(A) and (B) show plots of etch tilt angle (°) as a function of distance from the substrate edge for two different uniformity ring configurations on WEP structures with and without a metallic coating when a LF RF power of 380 kHz was provided to the substrate support during the etch process. A positive etch tilt angle corresponds to an outward tilt. FIG. 7(A) used a first stack of annular dielectric ring structures comprising a first uniformity ring stacked on top of a WEP structure. The process conditions used to obtain lines 702 (metallised annular dielectric ring structure 630) and 704 (non-metallised annular dielectric ring structure 630B) in FIG. 7(A) were identical. FIG. 7(B) used a second stack of annular dielectric ring structures comprising a second uniformity ring stacked on top of a WEP structure. The process conditions used to obtain lines 712 (metallised annular dielectric ring structure 630) and 714 (non-metallised annular dielectric ring structure 630B) in FIG. 7(B) were identical. The power applied to the substrate support 620 was in the range of 33-300 W.

In both instances (i.e. independent of the shape of the uniformity ring in the stack of annular dielectric ring structures), providing an electrically conductive coating 658 to the backside of the annular dielectric ring structure 630 reduced the magnitude of the etch tilt angle. For example, with reference to FIG. 7(A), the outward tilt was reduced from ~6° to ~1° (at 3 mm edge exclusion). Surprisingly, the presence of the electrically conductive coating 658 under optimised conditions enabled an inward tilt to be achieved, which can be further tuned by varying the platen power accordingly in order to aid flattening the plasma sheath at the edge of the substrate.

Figure 8:
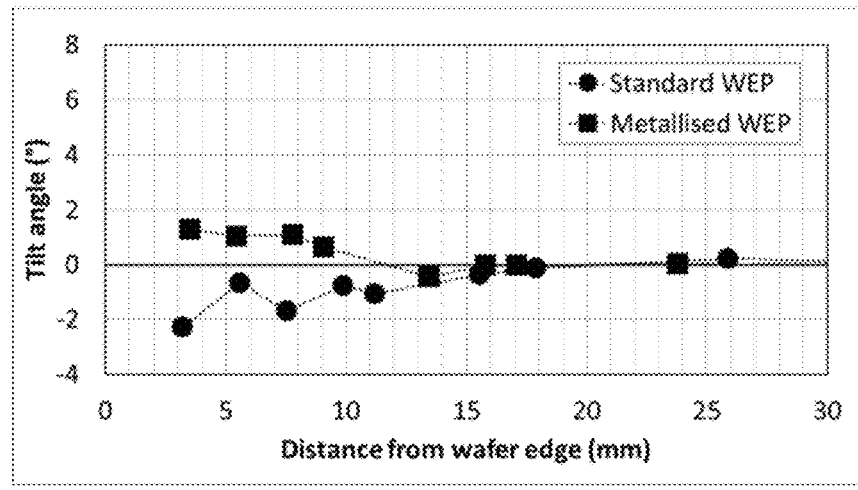
FIG. 8 shows a plot of etch tilt angle (°) as a function of distance from the substrate edge.

FIG. 8 shows a plot of etch tilt angle (°) as a function of distance from the substrate edge when a HF RF power of 13.56 MHz was provided to the substrate support during the etch process. A positive etch tilt angle corresponds to an outward tilt. Providing an electrically conductive coating 658 on the backside of the annular dielectric ring structure 630 (e.g. on the backside of WEP 634) results in a more inward etch tilt angle at the peripheral region of the substrate. An inward etch tilt angle can be optimised by fine tuning the platen power. Typically, a higher platen power results in a more outward etch tilt angle. Therefore, small process changes (rather than hardware changes) can be used to optimise the etch tilt angle at the peripheral region of the substrate providing improved process control.

Without wishing to be bound by any theory or conjecture, it is believed that the RF coupling efficiency reduces as the RF frequency is lowered because the capacitive impedance is inversely proportional to the frequency:

$$Z = \frac{1}{2\pi \cdot \vartheta \cdot C}$$

In this equation, Z is the impedance, $\vartheta$ is the RF frequency, and C is the capacitance. Again without being bound by any theory or conjecture, it is believed that the presence of the electrically conductive coating on the backside of the insulating annular dielectric ring (e.g. a WEP structure) enhances the RF coupling efficiency, in particular at low RF frequencies (e.g. ~<2 kHz, or ~380 kHz) where the original coupling is significantly weaker than at high frequencies (e.g. ~13.56 MHz). Due to the improved coupling brought by the electrically conductive coating 658, the curvature of the plasma sheath at the substrate edge is reduced, resulting in a reduction in the etch tilt angle at the peripheral region of the substrate.

Figure 9:
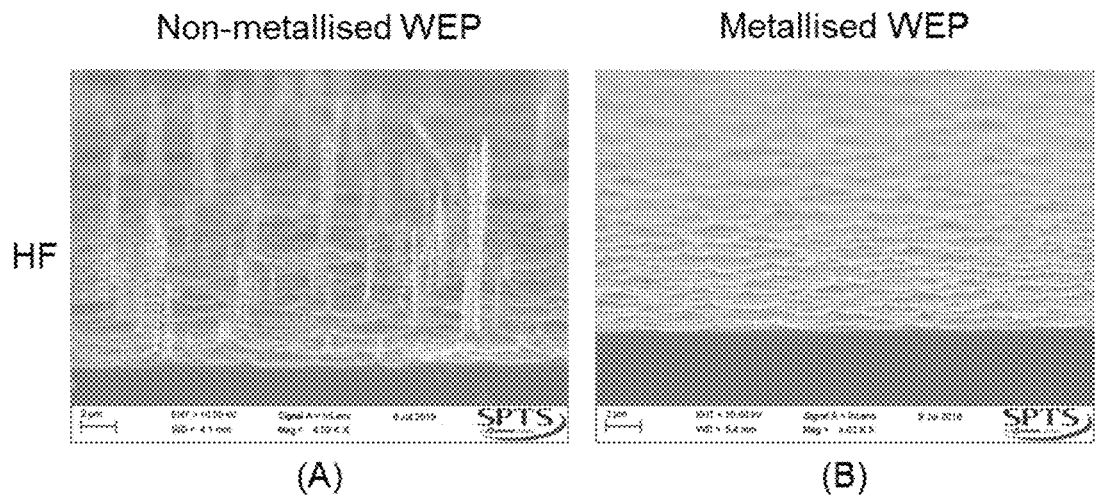
FIG. 9 shows SEM images of a substrate after an etching process, where (A) shows a non-metallised WEP and (B) shows a metallised WEP.

Furthermore, providing an electrically conductive coating 658 on the backside surface 646 of the annular dielectric structure 630 was also found to reduce the degree of micro-masking that occurs at the peripheral region of the substrate 612. Micro-masking occurs when the RF-powered area extends beyond the edge of the substrate 612, and in particular when the RF-powered area extends under the annular dielectric ring structure 630, so that surrounding ceramic parts (including the annular dielectric ring structure 630) are biased. As a result of this bias, the ceramic parts are physically sputtered by ion bombardment, and the sputtered material is redeposited onto neighbouring surfaces, including the peripheral region of the substrate 612. The redeposited (insulating) material, which is generally non-volatile, leads to micro-masking on the substrate 612. This results in an unwanted rough surface at the end of the etch process. FIG. 9 shows a peripheral portion of a 200 mm diameter substrate after an etch process in which HF RF power at 13.56 MHz was applied to the substrate support 620. The RF-powered area had a width of 221 mm, and the annular dielectric ring structure comprised a WEP structure having an inner diameter of 197 mm. When a non-metallised WEP structure (e.g. 630B) was used, large strands of unetched material remained on the surface of the substrate 612 due to micro-masking (FIG. 9(A)). On the other hand, when a metallised annular dielectric ring structure was used (e.g. 630 or 634), even though not completely remedied, the degree of micro-masking was significantly reduced (FIG. 9(B)).

Figure 10:
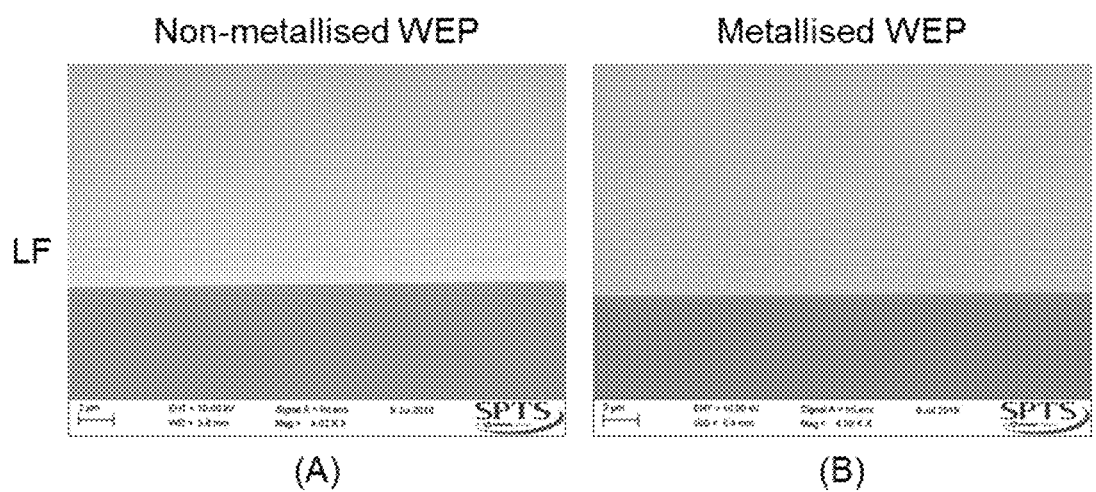
FIG. 10 shows SEM images of a substrate after an etching process, where (A) shows a non-metallised WEP and (B) shows a metallised WEP.

FIG. 10 shows a peripheral portion of a 200 mm diameter substrate after an etch process in which LF RF power at ~380 kHz was applied to the substrate support 620. Other process conditions were the same as described for FIG. 9. At low RF frequency, the degree of micro-masking is negligible when either a non-metallised annular dielectric ring structure (e.g. 630B) or a metallised dielectric ring (e.g. 630) is used. Without being bound by any theory or conjecture, it is believed that the degree of micro-masking is related to the inherent RF coupling, which may influence the sputtering yield of the ceramic parts. Notably, including an electrically conductive coating to the backside surface 646 of the annular dielectric ring structure can significantly reduce micro-masking, in particular when HF RF power is applied to the substrate support during the etch process.

The presence of an electrically conductive coating on the backside surface of an annular dielectric ring structure 630 (e.g. uniformity ring and/or WEP structure) can significantly improve the etch uniformity and etch tilt angle control at a peripheral region of the substrate (which is particularly beneficial at LF RF powers); and also can significantly reduce the degree of micro-masking (which is particularly beneficial at HF RF powers). Apparatus of the present invention (and associated methods of use) therefore provide improved control of the etch process, and allow a wider range of operation and process conditions during etching using HF or LF RF power applied to the substrate support.

The invention claimed is:

1. A plasma etching apparatus for etching a semiconductor substrate, the plasma etching apparatus comprising:
a plasma chamber;
a plasma generation device for sustaining a plasma within the plasma chamber;
a substrate support disposed within the plasma chamber for supporting the semiconductor substrate, the substrate support comprising an electrically conductive structure;
a power supply for providing an RF electrical signal having an RF power to the electrically conductive structure; and
an annular dielectric ring structure comprising a backside surface, the backside surface comprising an electrically conductive coating, wherein the electrically conductive coating comprises a radially inner region and a radially outer region;
wherein the electrically conductive structure is entirely spaced apart from and extends under the inner region of the electrically conductive coating so that the RF power provided to the electrically conductive structure couples capacitively to the electrically conductive coating;
wherein the electrically conductive coating has an electrical potential that is electrically floating; and
wherein at least some of the electrically conductive coating is disposed above the semiconductor substrate such that the semiconductor substrate is disposed between the substrate support and the electrically conductive coating.

2. The apparatus according to claim 1, wherein the annular dielectric ring structure comprises a wafer edge protection (WEP) structure.

3. The apparatus according to claim 2, wherein the radially outer region is spaced apart from the electrically conductive structure by a smaller distance than the radially inner region because the outer region is disposed on the WEP structure.

4. The apparatus according to claim 1, wherein the annular dielectric ring structure comprises a uniformity ring.

5. The apparatus according to claim 4, further comprising a semiconductor substrate positioned on the substrate support, wherein the uniformity ring comprises an inner diameter that is larger than the diameter of the semiconductor substrate by a distance in the range of 1-5 mm.

6. The apparatus according to claim 1, wherein the annular dielectric ring structure comprises a wafer edge protection (WEP) structure, wherein the annular dielectric ring structure comprises a uniformity ring, and wherein the uniformity ring is positioned on the WEP structure to form a stack of annular dielectric rings.

7. The apparatus according to claim 1, wherein the annular dielectric ring structure is made from a ceramic material.

8. The apparatus according to claim 1, wherein the electrically conductive coating is made from a metal or a metal alloy.

9. The apparatus according to claim 8, wherein the metal is aluminium or titanium.

10. The apparatus according to claim 1, wherein the electrically conductive coating has a non-zero thickness of less than about 50 μm.

11. The apparatus according to claim 1, wherein the annular dielectric ring structure comprises a frontside surface facing away from the substrate support, the frontside surface comprising a radially inwardly facing inclined portion.

12. The apparatus according to claim 1, wherein the electrically conductive structure comprises a conductive body and a conductive ring surrounding the conductive body.

13. The apparatus according to claim 1, wherein the substrate support comprises an electrostatic chuck (ESC).

14. The apparatus according to claim 1, wherein the RF electrical signal has a frequency of less than about 2 MHz.

15. The apparatus according to claim 1, wherein the RF electrical signal has a frequency of about 13.56 MHz.

16. The apparatus according to claim 1, wherein the RF electrical signal has a power in a range of 5-500 W.

17. The apparatus according to claim 1, wherein the semiconductor substrate is a silicon wafer.

18. The apparatus according to claim 1, wherein the plasma generation device is an inductively coupled plasma generation device.

* * * * *